United States Patent [19]

Leech et al.

[11] Patent Number: 5,178,988
[45] Date of Patent: Jan. 12, 1993

[54] PHOTOIMAGEABLE PERMANENT RESIST

[75] Inventors: Edward J. Leech, Oyster Bay; Steven M. Johnson, Schenectady, both of N.Y.

[73] Assignee: Amp-Akzo Corporation, Newark, Del.

[21] Appl. No.: 737,203

[22] Filed: Jul. 29, 1991

Related U.S. Application Data

[60] Division of Ser. No. 391,203, Aug. 11, 1989, Pat. No. 5,070,002, which is a continuation-in-part of Ser. No. 242,782, Sep. 13, 1988, abandoned.

[51] Int. Cl.$^5$ .................................................. G03C 1/72
[52] U.S. Cl. .................................... 430/280; 430/288; 522/31; 522/170; 522/137; 522/142
[58] Field of Search ............... 430/288, 280; 522/31, 522/170, 137, 142

[56] References Cited

U.S. PATENT DOCUMENTS

| | | | |
|---|---|---|---|
| 4,025,348 | 5/1977 | Tsukada et al. | 96/115 R |
| 4,074,008 | 2/1978 | Green | 428/418 |
| 4,119,609 | 10/1978 | Allen et al. | 528/39 |
| 4,156,035 | 5/1979 | Tsao et al. | 427/44 |
| 4,171,974 | 10/1979 | Golda et al. | 96/75 |
| 4,438,189 | 3/1984 | Geissler et al. | 430/280 |
| 4,548,895 | 10/1985 | Irving et al. | 430/325 |
| 4,621,048 | 11/1986 | Gervay | 430/281 |
| 4,624,912 | 11/1986 | Zweifel et al. | 430/258 |
| 4,657,779 | 4/1987 | Gaske | 427/54.1 |
| 4,714,751 | 12/1987 | Schornick et al. | 528/103 |
| 4,786,579 | 11/1988 | Tazawa et al. | 430/280 |
| 4,789,620 | 12/1988 | Sasaki et al. | 430/280 |

FOREIGN PATENT DOCUMENTS

| | | |
|---|---|---|
| 0206086 | 12/1986 | European Pat. Off. |
| 57-4647 | 1/1982 | Japan |
| 62-18722 | 8/1987 | Japan |

OTHER PUBLICATIONS

Chemical Abstracts 85: 162069m.
Patent Abstracts of Japan, vol. 12, No. 40 (C-474) [2887].
Japanese Laid Open Application 187,722 of 1987 (Derwent World Patent Index) Abstract.
Japanese Laid Open Application 75, 786 of 1976 (Derwent World Patent Index) Abstract.
Chemical Abstracts 108(26):229636h (Abstract of JP 62187722 of 1987).

Primary Examiner—Marion E. McCamish
Assistant Examiner—C. D. RoDee
Attorney, Agent, or Firm—Morgan & Finnegan

[57] ABSTRACT

Compositions which include an acidified epoxy oligomer, a free radical photoinitiator and a monomer capable of being polymerized by the photoinitiator are used to form aqueous developable, photodefined coatings useful as permanent solder marks for printed circuits and permanent plating resists for additive printed wiring boards. The process for using the compositions include application as a fluid in solvents; drying; exposing to ultraviolet light; developing in an aqueous alkaline solution; and crosslinking the acidified, epoxy oligomers. The articles produced include printed wiring boards with the permanent, photoimaged resist composition thereon.

12 Claims, No Drawings

PHOTOIMAGEABLE PERMANENT RESIST

This is a divisional of co-pending application Ser. No. 07/391,203 filed Aug. 11, 1989, now U.S. Pat. No. 5,070,002, which is a continuation-in-part of Ser. No. 07/242,782, filed Sep. 13, 1988, now abandoned.

FIELD OF THE INVENTION

This invention concerns photodefinable resist compositions useful as solder masks for printed wiring boards. The invention includes liquid compositions which are applied to printed wiring board substrates, dried, exposed by ultraviolet light, developed and cured to produce permanent photodefined solder masks.

BACKGROUND OF THE INVENTION

Solder resists are placed on a printed wiring board to protect selected areas of the conductive pattern from the action of molten solder. The solder resist pattern usually is applied to leave the terminal areas or lands exposed to the solder and to cover the rest of the conductors.

One type is the screen printed solder resists which are applied by by forcing a liquid resist coating through a stencil screen. The screen printed image is cured to a solid, thermoset coating by heat or ultraviolet energy.

Photoimaged resists can resolve finer image features and produce more tightly defined patterns than screen printed resists, and they are preferred for printed wiring boards with high density or fine line patterns.

A common type of photoresist is the dry film photoresist which is applied to the printed wiring board by hot roll lamination. The resist coated board is exposed to ultraviolet light through a photographic negative and developed in a solvent to remove the unexposed portions of the resist.

Another group of photoimageable, solder resists are applied to the printed wiring board as liquids by roller coating, curtain coating or blank screen printing without a stencil. The application method depends on the viscosity of the liquid and the chemistry of the resist. Roller coating and curtain coating have a disadvantage in that special equipment is required which is not generally available in printed wiring board manufacturing facilities.

The shelf life of the resist liquids also depends on the chemistry of the resists. Some liquid, photoimageable, solder resists cannot be supplied as a one part system because the one part system with those chemical components would have a shelf life of a few days or weeks. These are supplied as a two part system that the user mixes together before use. Two part systems must be mixed in house which creates quality control and storage problems for the user.

The exposure method for photoimaging the liquid, solder resists varies. Some are dried and then contact printed by exposure to ultraviolet light through a photographic negative. However, the low molecular weight resins in the dried, unexposed resist tend to get tacky during the exposure as the exposure equipment heats up in use. This causes the dried, resist film to stick to the negative. Other liquid, resist coatings are exposed wet with the negative off contact. These have the disadvantage of requiring a special off-contact printer which is a unique piece of equipment not generally used in the industry.

In another system, which also requires a specialized coating and exposure equipment, the negative is coated with resist which is partially cured to a gel. The printed wiring board is coated with liquid resist, placed in contact with the gel coated negative and exposed to ultraviolet light. The liquid resist on the board and the gelled resist on the negative adhere together and are solidified by the exposure.

The generally preferred method for applying liquid, photoimageable, solder resists is blank screen printing. Most of the solder resists applied by blank screen printing are two part systems which has restricted their use.

The photoimaged resists are developed after exposure to ultraviolet light by removing the unexposed portions of the resist with solvents. Organic or aqueous solvent developers are used depending on the chemistry of the resist. Aqueous developers are easier to waste treat and most users prefer resists that develop in aqueous sodium carbonate solutions.

The liquid, photoimageable, solder resists require a final cure after development. Standard cures are a very high energy ultraviolet exposure of 25–50 mJ/mm$^2$ plus a thermal cure of 30–60 minutes at 140°–160° C.

SUMMARY OF THE INVENTION

This invention comprises a negative acting photodefinable solder mask composition which comprises a polymeric matrix material, a polymerizable monomer, a free radical photoinitiator, an optional cationic curing agent and coating quality improvement additives. The monomer is selectively polymerized by exposure to ultraviolet radiation through a phototool. Unexposed resist is developed or removed by an aqueous alkaline solution to produce a relief image of a solder mask pattern. The pattern thus formed is baked to cure the polymeric matrix material into a rugged solder mask.

The polymeric matrix material is a partially acidified, multifunctional, epoxy resin having an acid number in the range of 15 to 60. This epoxy resin provides alkaline solubility in unexposed areas of the resist. In the regions of the coating exposed to ultraviolet light, the monomer polymerizes to bind and retain the epoxy through alkaline development to form a solder mask pattern. The epoxy constitutes the major constituent of the final solder mask coating.

Acid functionality integral to the epoxy resin acts as a cationic curing agent during the final thermal cure to crosslink itself. Additional acid functionality may be added to enhance or speed final thermal curing by incorporating a cationic curing agent in the formulation.

It is an object of this invention to provide a liquid, photoimageable, solder resist as a one component system with good shelf life.

It is also an object of this invention to provide a permanent, photoimagable resist that can be developed in aqueous solutions without use of organic solvents.

It is a further object to provide a liquid, photoimageable resist which when dried to tack free surface can be handled and exposed in conventional contact printing equipment.

It is also an object of the invention to provide a liquid, photoimageable, solder resist that can be fully hardened after exposure and development without a high energy ultraviolet radiation treatment.

DETAILED DESCRIPTION OF THE INVENTION

In one embodiment, this invention comprises a photoimageable resist with the resin solids of the dried resist comprising 50–75% of an oligomer which is an adduct of an epoxy compound and an amino-substituted aromatic acid, the oligomer being an acidified epoxy having both epoxide functional groups and carboxylic or phenolic acid functional groups, 2.5–8% of a free radical photoinitiator and 25–40% of a monomer capable of being polymerized by the action of the photoinitiator. In the preferred form of the invention, the resist composition is dissolved in a quantity of solvent sufficient to provide the right viscosity for application of the photoimageable resist to a substrate. More preferably, the resist comprises 54–68% of the acidified, epoxy oligomer, 2.8–7.3% of a free radical photoinitiator and 28–35% of a monomer capable of being polymerized by the action of the photoinitiator, all dissolved in a suitable quantity of solvent.

In another embodiment, the photoimageable resist of this invention comprises an addition to the resin solids of up to 60% of a solid filler. In this embodiment, the dried photoimageable resist preferably comprises 20–50% filler, 25–40% of an acidified, epoxy oligomer, 1–5% of a free radical photoinitiator and 7–20% of a monomer capable of being polymerized by the action of the photoinitiator.

The cured resist coating of the present invention is an interpenetrating, polymer network comprising a crosslinked polymer produced by a photointiated polymerization of a free radical polymerizable monomer and a crosslinked epoxy polymer produced by polymerization of an acidified epoxy oligomer. The preferred free radical polymerizable monomers are acrylic monomers having a functionality of at least three. The monomer is crosslinked by free radical polymerization into a three dimensional polymer by exposing the dried resist coating to ultraviolet radiation through a phototool corresponding to the desired resist image.

Subsequent to the exposure the resist image is developed by contact with an aqueous, alkaline solution which solubilizes the acidified, epoxy oligomer in the unexposed areas where it is not intermixed with the crosslinked monomer. Dilute alkali metal hydroxide solutions can be used as the aqueous, alkaline, developing solution. Potassium or sodium carbonate solutions are not as strongly alkaline as alkali metal hydroxide solutions and are preferred as developing solutions. Development will vary with the proportion of acidified, epoxy oligomer in the coating and its acid number. The amount of developing solution contacting the resist and the contact time are adjusted to be sufficient to dissolve away the unexposed portions of the coating.

Following development the acidified, epoxy oligomer intermixed with the crosslinked monomer undergoes an acid catalyzed polymerization into a three dimensional, crosslinked polymer and forms an interpenetrated, polymer network.

The use of an adduct of an amino-substituted acidic aromatic compound and an epoxy resin with functionality greater than 2 as the polymeric matrix in a photoimageable resist provides resists which are both suprisingly easy to develop and easy to post cure for the best mechanical, chemical and electrical properties. The only post cure required is only a thermal cure or bake, an additional high energy ultraviolet exposure is unnecessary. The acidified, multifunctional epoxy resin has in one compound the chemical properties which lead to easy development of the resist, excellent adhesion to the substrate, high chemical and solder resistance and good electrical insulation.

The combination of the acidified, multifunctional epoxy with a free radical photoinitiator and a high viscosity, multifunctional monomer capable of being polymerized by the free radical photoinitiator provides the surprising combination of fast low energy exposure for imaging and of good shelf life in a one part system.

The acidified, epoxy oligomer may be prepared by the procedure of Allen et al., U.S. Pat. No. 4,119,609, which is incorporated herein by reference. Allen et al. describe the preparation of adducts of epoxy compounds with amino-substituted carboxylic acids. Adducts for use in this invention are solid resins prepared by the reaction of an epoxy resin, having a epoxide functionality of greater than 2, and an amino-substituted acid. More preferably, they are prepared from epoxy resins, having an epoxide functionality about 3 or greater and most preferably about 5, and an amino-substituted acid. The acid number of the adduct (milligrams of KOH to neutralize one gram of adduct) should be high enough to permit aqueous development of an exposed resist coating, preferably greater than about 15, more preferably greater than 20. When the acid number is too high the resist solution will have a very short shelf life because the concentration of acid groups in the solution will cause the solution to gel. The acid number should be low enough to prevent gelation of the resist solution in storage. This will depend on the ratio of the acidified, epoxy oligomer resin to the solid monomer capable of polymerization by the photoinitiator, on the percent solvent in the solution, the size of the storage package and the storage temperature. When the acid number is greater than about 60, the resist image tends to break down in the developer, forming pinholes in the resist and losing the sharp edges of the image. Preferably, the acid number is less than 60, and more preferably is less than 45.

A suitable, acidified, epoxy oligomer was prepared by reacting a cresol novolac epoxy resin (EPON TM Resin DPS-164 from Shell Chemical Company) with 4-aminobenzoic acid following the procedures of Allen et al., U.S. Pat. No. 4,119,609. The cresol novolac epoxy resin has an epoxy equivalent weight of 200–240, an average of 5 epoxy functional groups per molecule and an average molecular weight of 1100. The cresol novolac epoxy resin was dissolved in 2-(2-methoxyethoxy)ethanol to form a 65% solution. Eight grams of 4-aminobenzoic acid (58 mmol) and 0.65 grams of a catalyst (BYK VP-451 TM, which has 18% p-toluenesulfonic acid as the active ingredient) were mixed into 100 grams of the solution containing approximately 59 mmol of the cresol novolac epoxy resin. The mixture was refluxed for two hours at 135°–145° C. This provided an acidified, epoxy oligomer with a molecular weight of approximately 100,000 as a 65% solution with an acid number of 32.

The monomer capable of polymerization by a free radical photoinitiator is a solid at room temperature or has a viscosity greater than 1 kPa-s. It is preferably an acrylic monomer having at least three acrylic or methacrylic functional groups, and more preferably is selected from the group consisting of pentaerythritol tetraacrylate, dipentaerythritol monohydroxy pentaacrylate and tris(2-hydroxyethyl)-isocyanurate triacrylate and mixtures thereof.

Free radical photoinitiators are well known. Suitable photoinitiators are described in U.S. Pat. Nos. 4,621,043 and 4,156,035. One of these suitable photoinitiators is 2,2-dimethoxy-2-phenylacetophenone, commercially available from Ciba-Geigy as IRGACURE 651 TM.

Various dyes and pigments may be added to increase the visibility of the resist image. Any colorant used, however, should preferably be transparent to the actinic radiation used. One suitable colorant is the phthalocyanine green described by the number PG-36,2Y in the Color Index of the American Association of Textile Chemists and Colorists and the Society of Dyers and Colourists.

The resist composition is dissolved in a solvent for application of the resist. The solvent used and the amount used depend on the methods employed for coating and drying the resist. The viscosity for curtain coating is usually adjusted between 0.1 and 10 Pa-s depending on the equipment used, the coating speed, and the desired resist film thickness. Sufficient solvent must be used to obtain a resist solution of the desired viscosity. Low boiling solvents may be used for high speed or low temperature drying. It may be preferable in some installations to use high boiling solvents and higher drying temperatures to avoid frequent solvent additions to the curtain coater reservoir.

Blank screen application of liquid resist is preferred by many printed wiring board manufacturers because the screen printing techniques are well known and the equipment is readily available. For blank screen application of the resist solution, the preferred viscosity is 20–200 Pa-s. More preferred is a viscosity of 45–90 Pa-s. High boiling solvents are preferred for blank screen application to prevent resist solution from drying on the screen. Suitable high boiling solvents include 2-butoxyethanol, 2(2-methoxyethoxy)ethanol and gamma-butyrolactone.

The acidic functionality integral to the epoxy resin may be used as the curing agent during the final thermal cure of the resist. Faster and enhanced thermal cures may be obtained by addition of Lewis acid curing agents to the resist formulation. To minimize cure at ambient temperatures during storage and extend the shelf life of the resist, a Lewis acid precursor which is stable at storage temperatures of 5°–30° C. and capable of releasing a Lewis acid at elevated temperatures above 100° C. is preferred. Among the suitable Lewis acid precursors are boron trichloride organic amine salts, the aromatic onium salts of Group VIa elements and diaryliodonium salts. The aromatic onium salts of Group VIa elements are preferred. These salts are well known as photoinitiators for ultraviolet initiated cationic cure of polyepoxides by releasing a Lewis acid when exposed to the ultraviolet energy, however, the Lewis acid also is released at elevated temperatures without ultraviolet radiation.

Fillers are added to raise the viscosity, to give the resist body or film forming characteristics and to reduce the tack of the dried, resist film. Photoresists with high filler loadings have reduced tack and do not tend to stick to the negative during exposure. Suitable fillers include talc, aluminum silicate pigments, alumina trihydrate, alumina spheres (commercially available from Zeelan Industries, Minnesota), barium sulfate pigment (blanc fixe), fumed silica and amorphous silica (commercially available from PPG Industries, Inc., Barberton, Ohio).

A release agent can be incorporated into the resist solution to further insure that the resist will not stick to the photographic negative. The release agent should be selected so that it migrates out of the resist solution to the surface of the resist as the resist coating is dried. Suitable release agents are fatty acid derivatives having low cloud points in the resist solution. A preferred release agent is a fatty acid amide available from Akzo Chemie America, Chicago, Ill. as ARMID O TM. The concentration of the release agent in the resin solution should be sufficient to provide a uniform release layer on the dried resist surface, and preferably sufficient to reduce oxygen inhibition of the free radical polymerization reaction.

Other components of the resist solution may include rheology control additives well known in the art. Illustrative of these additives are Silicone SAG TM from Union Carbide Corp., the fluorocarbon wetting agent, FC 430 TM, from 3M Co., the multifunctional silicone acrylate F737 TM from Wacker Chemical and ethyl acrylate polymer, MODAFLOW TM of the Monsanto Co.

An acidified, multifunctional, epoxy oligomer suitable for use as the polymeric matrix material according to this invention is manufactured by Schenectady Chemicals Co. as HRJ 4586 TM. HRJ 4586 is available as a 65% solids solution in 2-butoxyethanol. A similar, acidified, multifunctional, epoxy oligomer is available as a 65% solution in 2-(2-methoxyethoxy)ethanol as HRJ 10627 TM. These solutions have viscosities in the range of 20-24 Pa-s. At temperature, the viscosity of the HRJ 4586 solution increases with time due to the acidic functionality integral to the epoxy resin acting as cationic curing agent to partially polymerize the epoxy resin. This partial polymerization is inhibited at lower temperatures.

The HRJ 4586 solution, at 24 Pa-s as received, is too fluid for compounding into a resist solution suitable for blank screen application. To obtain a more viscous solution that can be formulated into a 100% resin solids resist solution for blank screen application, the HRJ 4586 solution is allowed to partially polymerize until the viscosity is approximately 300 Pa-s. This partial polymerization can be accomplished in approximately a week or 10 days at room temperature or in 18 hours at 50° C. When the solution reaches the desired viscosity, the polymerization reaction is quenched by cooling the solution below room temperature. The resin solution may be stored at temperatures below 15° C., and has an indefinite shelf life at temperatures between 0° and 5° C.

The carboxylic acid functional groups in the resin react with epoxy functional groups to increase the average molecular weight of the resin, and to increase the viscosity of the solution. This reaction may be controlled by either the viscosity increase as the molecular weight increases or the acid number decrease as carboxylic functional groups react. An HRJ 10627 solution of the acidified, epoxy oligomer in 2-(2-methoxyethoxy)ethanol which had been stored at 5° C. was warmed to partially polymerize the oligomer and increase the average molecular weight. The molecular weight, solution viscosity and acid number changed as follows:

| HRJ 10627 | | |
|---|---|---|
| Viscosity Pa-S | Acid Number | Molecular Weight % Increase |
| 20 | 34.51 | 0 |
| 84 | 31.08 | 11 |
| 200 | 28.53 | 21 |
| 700 | 24.75 | 40 |

Surprisingly, although the the resin solution has a short shelf life at room temperature, a 100% resin solids, photoimageable, solder resist solution has a shelf life of at least six months at 25° C. when the acidified, epoxy resin has been partially polymerized to reduce the acid number and is mixed with the other components to form photoimageable, solder resist solution of this invention. The shelf life is extended indefinitely by low temperature storage at 5°–15° C. Photoimageable, solder resist solutions using oligomers with high acid numbers are more reactive. Photoimageable resists according to this invention having high filler loadings preferably use oligomers with high acid numbers and have a shelf life of two to four weeks at room temperature. Such resists have shelf lives over six months when stored at 5°–10°C.

The use of the partially polymerized resin to form a photoimageable solder resist is shown in Examples 1–6 below.

EXAMPLE 1

A 65% solids solution in 2-butoxyethanol of an adduct of a multifunctional, epoxy resin and a amino-substituted carboxylic acid was supplied by Schenectady Chemicals as HRJ 4586. The solution had a viscosity of 24 Pa-s as measured with a Brookfield Model Viscometer and a No. 1 spindle. The adduct was reacted to partially polymerize it. When the HRJ 4586 solution reached 300 Pa-s the polymerization reaction was quenched by cooling to 4° C.

A photoimageable solder resist was prepared to the following formulation:

| Component | Parts by Weight |
|---|---|
| HRJ 4586 (65% by weight in 2-butoxyethanol) | 203 |
| Pentaerythritol tetraacrylate (available from Sartomer Co. as SR295 TM) | 66 |
| Silicone F737 (Wacker Chemical) | 7 |
| Triphenylsulfonium hexafluoroantimonate (available from General Electric Co. as UVE 1014 TM) | 3 |
| Silicone (SAG 471 from Union Carbide) | 3 |
| Alkyl acrylate polymer flow promoter (MODAFLOW from Monsanto) | 3.6 |
| Fluorocarbon Surfactant (FC-430 from 3M Co.) | 1 |
| Phthalocyanine green pigment | 1.5 |
| 2,2-dimethoxy-2-phenylacetophenone (IRGACURE 651 from Ciba-Geigy) | 14 |
| Gamma-butyrolactone | 15.6 |

The ingredients were mixed on a Cowles Dissolver. The resist solution produced had a viscosity of 30 Pa-s, and was suitable for blank screen application.

Printed wiring boards with a conductive pattern of copper 35 micrometers thick were cleaned for application of solder resist and coated with the above resist liquid by the blank screen technique. The screen was a polyester 60HD mesh which deposited a wet film 75–90 micrometers thick.

The wet coating was dried by heating to 80° C. for 30 minutes. The dry film thickness was 55–65 micrometers.

The coated printed wiring board was exposed to ultraviolet light through a solder resist phototool. The coating was exposed by 2.5 mJ/mm$^2$ of ultraviolet light. The solder resist image was developed with spray of 1% aqueous solution of sodium carbonate at 30° C., followed by rinsing and drying. The minimum width of a phototool feature resolved by the resist was 50 micrometers.

The solder resist image was thermal cured by heating the printed wiring board to 145° C. for one hour to fully polymerize and crosslink the epoxy resin adduct.

The solder resist image was tested according to the Institute for Interconnecting and Packaging Electronic Circuits standard for solder resists, IPC-SM-840B. Printed wiring board test panels with the solder resist image were tested by thermal cycling, soldering and tested for hydrolytic stability, resist adhesion, chemical resistance and solvent resistance. The solder resist qualified under Class III, the highest class of IPC-SM-840B.

EXAMPLE 2

Liquid photoimageable solder resists for blank screen application were prepared as in Example 1 except that the photosensitive Lewis acid precursor, triphenylsulfonium hexafluoroantimonate, was omitted.

The resists were applied to printed wiring boards by the blank screen technique, dried, exposed with ultraviolet light through a phototool and developed as in Example 1. After development, the printed wiring boards were baked at 160° C. for one hour which polymerized and crosslinked the epoxy resin adduct with only the acid functionality integral to the resin acting as the cationic curing agent.

The printed wiring boards were soldered at 288° C. with no failure of the solder resist image. The solder resist images on the printed wiring boards were tested for adhesion by the crosshatch test (ASTM Standard D3359) and no failures were observed.

EXAMPLE 3

Liquid photoimageable resists were prepared by the procedures of Example 1 according to the following table.

| Component | Parts by Weight I | Parts by Weight II |
|---|---|---|
| Acidified Multifunctional Epoxy Resin (100% solids)[1] | 60–73 | 60–73 |
| Solid acrylic monomer[2] | 30–40 | 30–40 |
| Free radical photoinitiator[3] | 3–4 | 6–8 |
| Aromatic onium salt as Lewis acid precursor[4] | 3.5–4.5 | 2–4 |
| Coating Additives[5] | as required to control flow, bubbles, "fish eyes", "orange peel" and leveling. | |
| Solvent 6 | to viscosities | |

-continued

| Component | Parts by Weight | |
|---|---|---|
| | I | II |
| | | of 25-35 Pa-s. |

[1] HRJ 4586 from Schenectady Chemical Company, partially polymerized to give viscosities of 250-350 Pa-s as a 65% solution in 2-butoxyethanol.
[2] Dipentaerythritol monohydroxy pentaacrylate (SR399 TM) or Pentaerythritol Tetraacrylate (SR295 TM) or Tris(2-hydroxyethyl)isocyanurate Triacrylate (SR368 TM) all from Sartomer Co.
[3] IRGACURE 651
[4] UVE 1014 TM from General Electric Co. or UVI 6974 TM from Union Carbide.
[5] Silicone SAG 471 from Union Carbide, Wetting Agent FC430 from 3M Co., Multifunctional Silicone Acrylate F737 from Wacker Chemical and MODAFLOW from Monsanto.
[6] 2-butoxyethanol or 2-(2-methoxyethoxy)ethanol or gamma-butyrolactone.

The liquid photoimageable solder resists were applied to printed circuit test patterns by doctor blade application and by blank screen application using a 110 mesh polyester screen. The wet film thicknesses were 55-70 micrometers and the dry film thicknesses 45-55 micrometers. The dried resists were exposed to ultraviolet light through a phototool; the energies used to expose the resists were 2-4 mJ/mm$^2$. The resist images were developed in an aqueous spray developer, the developer solutions were 0.25-1% sodium carbonate. In some tests, the resist images were developed by immersion in a stirred solution of 1% sodium carbonate.

All the test patterns with solder resist images passed adhesion and soldering tests without failure.

EXAMPLE 4

An acidified multifunctional epoxy resin, 65% solids in 2-butoxyethanol with a viscosity of 24 Pa-s, HRJ 4586 from Schenectady Chemical, as received without partially polymerizing the resin or increasing its viscosity, is mixed with an acrylic monomer, a free radical photoinitiator, a aromatic onium Lewis acid precursor, additives and solvent as in Example 3, except that the additives and solvent are adjusted to obtain a photoimageable resist solution with a viscosity of 1 Pa-s.

The resist solution is applied to printed wiring boards by the curtain coating technique. The wet film thickness is approximately 80 micrometers. The printed wiring boards are passed through a tunnel drier at 95° C. to dry the coating. The dry film thickness of the photoimageable resist coating on the printed wiring boards is approximately 50 micrometers. The resist coated printed wiring boards are exposed to ultraviolet light through a phototool. The exposures are made in a water cooled printer which minimizes the heat transmitted to surface of the printed wiring board during the exposure. The printed wiring boards are sprayed with a 1% solution of sodium carbonate, to develop the resist image. After rinsing and drying, the printed wiring boards are heated to 160° C. to thermally cure the acidified epoxy resin. The photoimaged solder resist and the printed wiring boards are tested by the procedures of IPC-SM-840B and pass all the tests.

EXAMPLE 5

The procedure of Example 1 was repeated except that the HRJ 4586 solution was partially polymerized until the viscosity of the 65% solids solution was 350 Pa-s and only half the additional solvent was added. As in Example 1, the partially polymerized HRJ 4586 was mixed with the other components of the resist solution on a Cowles Dissolver. The resulting resist solution had a viscosity of 156 Pa-s.

The resist solution was applied to printed wiring boards by screen printing. The wet film thickness was 65-80 micrometers. Instead of using blank screen printing, a "dot stencil" screen was used. The "dot stencil" has a dot corresponding to each hole center in the printed wiring board. The use of the "dot stencil" screen prevents filling the holes in the printed circuit board with resist, and makes development easier.

After applying the resist to the printed wiring boards it was dried for 45 minutes at 80°. The dry film thickness was 55-70 micrometers.

The printed wiring boards coated with the photoimageable resist were exposed to ultraviolet light through a phototool; developed in a spray developer with a 1% aqueous solution of sodium carbonate; rinsed; dried and thermally cured for 1 hour at 70° C.

The solder resist image faithfully reproduced the image on the phototool. The solder resist had good adhesion to the printed wiring board and successfully passed soldering and adhesion tests.

EXAMPLE 6

A board consisting of an epoxy-glass laminate clad with a resin/nitrile rubber adhesive layer was coated with a photoimageable resist solution prepared as in Example 1. The adhesive clad epoxy-glass laminate is used for the production of additive printed wiring boards and is provided with a surface containing a catalyst for electrolessly depositing metal.

The resist solution was applied to the adhesive clad laminate by blank screen printing through a 65 mesh polyester screen. The solution was dried as in example 1, providing a photoimageable coating over the adhesive. The coated board was exposed to light through a photographic master, developed and thermally cured as in example 1 to produce a conductive pattern having the adhesive layer exposed where conductors were desired surrounded by a permanent insulating resist.

The exposed adhesive areas were adhesion promoted in a hot solution of chromic and sulfuric acid and then immersed for approximately 12 hours in an electroless copper plating solution having a temperature of 72° C. and a pH of 12 (measured at 25° C.). This deposited a copper conductive pattern 35-40 micrometers thick forming an additive printed circuit. The photoimaged resist layer was unaffected and proved to be an acceptable permanent plating resist for additive printed wiring boards.

EXAMPLE 7

This example illustrates the use of an acidified, epoxy oligomer with a high acid number in conjunction with high filler loading to form a photoimageable, solder resist. The resist solution had the following composition.

| | |
|---|---|
| Acidified, epoxy oligomer - 65% solution (HRJ 10627 from Schenectady Chemical) | 39.2% |
| Digylcidyl ether of bisphenol A (DER 661 TM from Dow Chemical Co.) | 0.3% |
| Pentaerythritol tetraacrylate (SR295 from Sartomer Co.) | 13.3% |
| 2,2-dimethoxy-2-phenylacetophenone (IRGACURE 651 from Ciba-Geigy Corp.) | 1.9% |
| Alumina trihydrate - median particle size 1.5 micrometers (MICRAL 932 TM from Solem Ind., Inc. Norcross, Georgia) | 39.3% |
| Fatty acid amide (ARMID O TM from Akzo Chemie America, Chicago, Illinois) | 2.5% |
| 2-(2methoxyethoxy)ethanol | 2.3% |
| Silicone surfactant (SAG 472 from Union | 0.9% |

-continued

| | |
|---|---|
| Carbide Corp.) | |
| Flow promoter (MODAFLOW from Monsanto Co.) | 0.7% |
| Phthalo Green - CI Pigment Green 7 | 0.4% |
| (SUNFAST 264-3040 from Sun Chemical Corp., Cincinnati, Ohio) | |
| 2-(2-butoxyethoxy)ethanol | 0.4% |

A concentrated mold release solution of 67% fatty acid amide (ARMID O) in 2-(2-methoxyethoxy)ethanol was prepared by heating and mixing same at 135° C.

The ingredients were dispersed, one at a time, into the 65% solution of acidified, epoxy oligomer. Mixing was controlled and cooling used as required to maintain the mixing temperature below 40° C. The alumina trihydrate filler was added last. When the filler was dispersed, the mixing was completed by milling on a three roll mill, still maintaining the temperature less than 40° C. After milling, the resist solution had a viscosity of 65 Pa-s at 25° C. The finished resist solution was stored at 5° C.

The resist solution was applied to a printed wiring board at room temperature. The resist solution was applied by a seriographic technique through a 110 mesh open screen. The open screen had no pattern so one side of the printed wiring board was completely covered with a film of liquid resist 0.04/mm (1.5 mil) thick. The board was dried vertically in a wicket oven at 75° C. for twenty minutes to remove the solvent and harden the resist film sufficiently to permit a second application to the other side of the printed wiring board. The resist solution then was applied to the second side of the printed wiring board in the same manner, except that the second side was dried for 30 minutes at 75° C. to completely remove solvent and dry the resist films sufficiently for photographic exposures. The dried resist films were approximately 0.03/mm (0.0012 mil) thick.

Photographic negatives of the solder resist pattern for the printed wiring board in contact with the dried resist films on the printed wiring board were placed in a vacuum frame and exposed to ultraviolet light. The exposure energy was 4 mJ/mm$^2$ which is sufficient to polymerize the multifunctional acrylate monomer. After exposure the negative were easily removed without sticking to the resist.

The exposed resist was allowed to stabilize for 10 minutes and then solder resist pattern was spray developed in a 1% sodium carbonate solution at 30° C. After rinsing and drying, the acidified, epoxy oligomer was crosslinked by a thermal cure at 135° C. for 45 minutes.

The solder resist image was tested according to the Institute for Interconnecting and Packaging Electronic Circuits standard for folder resists, IPC-SM-840B, and the solder resist qualified under Class III.

EXAMPLE 8

A resist solution according to Example 7 is reverse roller coated on polyethylene terephthalate film, and the solution is dried 75° C. for 15 minutes. This forms a dry film of resist adhered to the polyethylene terephthalate film which is interleaved with polyethylene film and stored at 5° C.

Additional resist solution is applied by the open screen technique to a epoxy glass laminate clad with a resin/nitrile rubber adhesive layer. The resist solution on the laminate is dried at 75° C. for 15 minutes. The dry film resist on the polyethylene terephthalate film is laminated over the resist layer on the laminate by removing the polyethylene interleaf and laminating in a hot roll laminator with the rolls at 160° C. and a speed of 0.3–0.6 m/min.

The double layer of resist is exposed through a photographic negative, and developed in a 1% sodium carbonate solution. This leaves the adhesive layer exposed in the conductive pattern of a printed wiring board. The exposed adhesive is adhesion promoted and electrolessly plated with copper to form an additive printed circuit board.

EXAMPLE 9

N,N,N,N'-tetraglycidyl-alpha,alpha'-bis(4-amino-3,5,-dimethylphenyl)-p-diisopropylbenzene, a tetrafunctional epoxy resin (EPON HPT TM Resin 1072 from Shell Chemical Co.) having an epoxy equivalent weight of 195 is dissolved in 2-(2-methoxyethoxy)ethanol. A portion of the solution containing 27.2 grams (34.9 mmol) of the epoxy resin is refluxed with 3.77 grams (34.5 mmol) of 4-aminophenol and a toluene disulfonic acid catalyst to form an acidified, epoxy oligomer. A photoimageable, solder resist with the solution containing the acidified, epoxy oligomer is formulated as follows:

| | |
|---|---|
| Acidified, epoxy oligomer (solids) | 31.0 grams |
| Dipentaerythritol pentaacrylate (SR399 TM from Sartomer) | 14.2 grams |
| 2,2-dimethylphenylacetophenon (IRGACURE 651) | 2.0 grams |
| Silicone Surfactant (SAG 471) | 1.0 gram |
| Fatty acid amide anti-blocking agent (ARMID O) | 2.7 grams |
| Flow Control Agent (MODAFLOW) | 0.8 grams |
| Blanc Fixe Filler (BaSO$_4$) | 10.0 grams |
| Fumed Silica Filler (AEROSIL 200 TM from Degussa Corp.) | 1.0 gram |
| 2-(2-methoxyethoxy)ethanol | to adjust viscosity. |

The photoimageable, solder resist solution is applied to a printed wiring board by the open screen technique. It is dried at 70° C. for twenty minutes. After cooling to room temperature, the resist is exposed through a phototool to 5 mJ/mm$^2$ of ultraviolet light to crosslink the acrylate monomer. The image is developed in a 1% potassium carbonate solution, rinsed, dried and heated to 160° to crosslink the acidified, oligomer and cure the solder resist.

EXAMPLE 10

Following the procedures of Allen et al., U.S. Pat. No. 4,119,609, adducts of multifunctional epoxy resins and amino-substituted aromatic acids are prepared according to the following table.

| Epoxy Resin Functionality | Epoxy Resin grams | p-Amino-benzoic Acid grams | Adduct Acid Number |
|---|---|---|---|
| 2.4[1] | 2600 | 400 | 60 |
| 3.6[2] | 2600 | 200 | 30 |
| 5.4[3] | 2600 | 100 | 15 |

[1]EPOXY RESIN XB-3337 TM from Ciba-Geigy Corp.
[2]DEN 431 TM from Dow Chemical Co.
[3]ECN 1299 TM from Ciba-Geigy Corp.

Using these resins, liquid photoimageable resist solutions are prepared, applied, imaged, developed and cured as in example 3. Similarly, resists are prepared as in Example 7 using talc and amorphous silica as fillers. The photoimaged resists pass solder and adhesion tests.

What is claim is:

1. A composition capable of being photoimaged, of being developed in aqueous solutions, and of forming a permanent, photodefined pattern on a surface, the composition comprising:
   a free radical photoinitiator,
   a monomer capable of being polymerized by action of the photoinitiator, said monomer having a viscosity greater than about 1 kPa-s or being a solid at room temperature;
   a resinous compound, selected from solid, resinous compounds having epoxide and acidic functional groups, the epoxide functionality of the resinous compound being greater than 2, and the acid number being greater than about 15 and less than about 60.

2. The composition of claim 1 wherein the solid, resinous compound is selected to have epoxide functionality sufficient to impart to the permanent, photodefined coating resistance to attack by solvent or molten solder.

3. The composition of claim 1 wherein the solid resinous compound is an adduct of amino-substituted aromatic acid and an epoxy resin having an average molecular weight greater than about 700, and an epoxide functionality greater than about 3.

4. The composition of claim 1 wherein the solid monomer capable of being polymerized by the action of the free radical photoinitiator is an acrylic monomer having at least three acrylic or methacrylic functional groups.

5. The composition of claim 4 wherein the acrylic monomer is selected from the group consisting of pentaerythritol tetraacrylate, dipentaerythritol monohydroxy pentaacrylate and tris(2-hydroxyethyl)isocyanurate triacrylate and mixtures thereof.

6. The composition of claim 4 wherein the weight of the solid, resinous compound in the coating is from about 1.5 times to about 3 times the weight of the monomer.

7. The composition of claim 4 wherein the composition further includes a filler wherein the weight of the filler is from 0.25 times to 1.5 times the combined weight of the resinous compound and the monomer.

8. The composition of claim 7 wherein the composition further includes from 0.1 to 5% by weight of a fatty acid amide as a release agent.

9. The composition of claim 1 further comprising a Lewis acid precursor which is stable at storage temperatures and capable of releasing a Lewis acid curing agent at elevated temperatures.

10. The composition of claim 9 wherein the Lewis acid precursor is selected from aromatic onium salts of Group VIa elements.

11. The composition of claim 10 wherein the Lewis acid precursor is triphenyl sulfonium hexafluoroantimonate.

12. The composition of claim 1 wherein the composition further includes from 0.1 to 5% by weight of a release agent.

* * * * *